(12) United States Patent
Zhang et al.

(10) Patent No.: US 7,118,941 B2
(45) Date of Patent: Oct. 10, 2006

(54) METHOD OF FABRICATING A COMPOSITE CARBON NANOTUBE THERMAL INTERFACE DEVICE

(75) Inventors: Yuegang Zhang, Cupertino, CA (US); Valery M. Dubin, Portland, OR (US); C. Michael Garner, Pleasanton, CA (US)

(73) Assignee: Intel Corporation, Santa Clara, CA (US)

( * ) Notice: Subject to any disclaimer, the term of this patent is extended or adjusted under 35 U.S.C. 154(b) by 52 days.

(21) Appl. No.: 10/607,390

(22) Filed: Jun. 25, 2003

(65) Prior Publication Data

US 2004/0266065 A1 Dec. 30, 2004

(51) Int. Cl.
*H01L 21/48* (2006.01)

(52) U.S. Cl. .............. 438/122; 438/680; 257/706; 977/735.1 E

(58) Field of Classification Search ............ 438/122, 438/125, 680, 674; 257/706; 977/735.1 E
See application file for complete search history.

(56) References Cited

U.S. PATENT DOCUMENTS

| 5,780,101 | A |   | 7/1998  | Nolan et al. |
|-----------|---|---|---------|--------------|
| 5,965,267 | A |   | 10/1999 | Nolan et al. |
| 6,156,256 | A | * | 12/2000 | Kennel ................ 264/461 |
| 6,283,812 | B1 | * | 9/2001 | Jin et al. ............... 445/24 |
| 6,303,094 | B1 |   | 10/2001 | Kusunoki et al. |
| 6,325,909 | B1 |   | 12/2001 | Li et al. |
| 6,350,488 | B1 |   | 2/2002 | Lee et al. |
| 6,361,861 | B1 |   | 3/2002 | Gao et al. |
| 6,383,923 | B1 | * | 5/2002 | Brown et al. ............... 438/666 |
| 6,407,922 | B1 | * | 6/2002 | Eckblad et al. ........... 361/704 |
| 6,420,293 | B1 |   | 7/2002 | Chang et al. |
| 6,440,761 | B1 |   | 8/2002 | Choi |
| 6,445,006 | B1 |   | 9/2002 | Brandes et al. |
| 6,495,258 | B1 |   | 12/2002 | Chen et al. |
| 6,528,020 | B1 |   | 3/2003 | Dai et al. |
| 6,531,828 | B1 |   | 3/2003 | Yaniv et al. |
| 6,628,053 | B1 |   | 9/2003 | Den et al. |
| 6,737,939 | B1 | * | 5/2004 | Hoppe et al. ............. 333/186 |
| 6,741,019 | B1 |   | 5/2004 | Filas et al. |
| 2001/0009693 | A1 |   | 7/2001 | Lee et al. |
| 2001/0024633 | A1 |   | 9/2001 | Lee et al. |
| 2002/0172767 | A1 |   | 11/2002 | Grigorian et al. |
| 2002/0197752 | A1 |   | 12/2002 | Choi |
| 2003/0064169 | A1 |   | 4/2003 | Hong et al. |
| 2004/0137730 | A1 | * | 7/2004 | Kim et al. ............... 438/689 |
| 2005/0064185 | A1 | * | 3/2005 | Buretea et al. ............. 428/364 |

FOREIGN PATENT DOCUMENTS

KR        2002038035      *   5/2002

OTHER PUBLICATIONS

Dubin, et al., "Packaging of Integrated Circuits With Carbon Nano-Tube Arrays to Enhance Heat Dissipation Through a Thermal Interface", U.S. Appl. No. 10/357,927, filed Feb. 3, 2003, 28 Pgs.

(Continued)

*Primary Examiner*—Caridad Everhart
(74) *Attorney, Agent, or Firm*—Kerry D. Tweet

(57) ABSTRACT

A composite carbon nanotube structure including a number of carbon nanotubes disposed in a metal matrix. The composite carbon nanotube structure may be used as a thermal interface device in a packaged integrated circuit device.

35 Claims, 9 Drawing Sheets

OTHER PUBLICATIONS

Li, et al., "Highly-Ordered Carbon Nanotube Arrays for Electronics Applications", Applied Physics Letters, vol. 75, No. 3, Jul. 19, 1999, pp. 367-369.

Wei, et al., "Organized Assembly of Carbon Nanotubes", Nature, vol. 416, Apr. 4, 2002, Macmillan Magazines Ltd., pp. 495-496.

Papadopoulos, et al., "Electronic Transport in Y-Junction Carbon Nanotubes", Physical Review Letters, vol. 85, No. 16, Oct. 16, 2000, The American Physical Society, pp. 3476-3479.

Li, et al., "Growing Y-Junction Carbon Nanotubes,",Nature, vol. 402, Nov. 18, 1999, Macmillan Magazines Ltd., pp. 253-254.

Liu, et al., "Fullerene Pipes", Science, vol. 280, May 22, 1998, pp. 1253-1256.

Avouris, et al., "Carbon Nanotube Electronics", Abstract No. 52, Philadelphia meeting abstracts vol. 2002-1, 201st Meeting of The Electrochemical Society, Philadelphis, PA, May 2002, 3 Pgs.

Zhang, et al., "Substrate-Site Selective Growth of Aligned Carbon Nanotubes", Applied Physics Letters, vol. 77, No. 23, Dec. 4, 2000, American Institute of Physics, pp. 3764-3766.

Bower, et al., "Plasma-Induced Alignment of Carbon Nanotubes", Applied Physics Letters, vol. 77, No. 6, Aug. 7, 2000, American Institute of Physics, pp. 830-832.

Fan, et al., "Self-Oriented Regular Arrays of Carbon Nanotubes and Their Field Emission Properties", Science, vol. 283, Jan. 22, 1999, pp. 512-514.

U.S. Appl. No. 10/607,525, filed Jun. 25, 2003, Valery M. Dubin, Pending.

* cited by examiner

US 7,118,941 B2

METHOD OF FABRICATING A COMPOSITE CARBON NANOTUBE THERMAL INTERFACE DEVICE

RELATED APPLICATION

This application is related to application Ser. No. 10/607,525, entitled "Methods of Fabricating a Composite Carbon Nanotube Thermal Interface Device", filed on even date herewith.

FIELD OF THE INVENTION

The invention relates generally to the packaging of an integrated circuit die and, more particularly, to a method for manufacturing a composite carbon nanotube structure that may be used as a thermal interface device.

BACKGROUND OF THE INVENTION

Illustrated in FIG. 1 is a conventional packaged integrated circuit device 100. The integrated circuit (IC) device 100 may, for example, comprise a microprocessor, a network processor, or other processing device, and the IC device 100 may be constructed using flip-chip mounting and Controlled Collapse Chip Connection (or "C4") assembly techniques. The IC device 100 includes a die 110 that is disposed on a substrate 120, this substrate often referred to as the "package substrate." A plurality of bond pads on the die 110 are electrically connected to a corresponding plurality of leads, or "lands", on the substrate 120 by an array of connection elements 130 (e.g., solder balls, columns, etc.). Circuitry on the package substrate 120, in turn, routes the die leads to locations on the substrate 120 where electrical connections can be established with a next-level component (e.g., a motherboard, a computer system, a circuit board, another IC device, etc.). For example, the substrate circuitry may route all signal lines to a pin-grid array 125—or, alternatively, a ball-grid array—formed on a lower surface of the package substrate 120. The pin-grid (or ball-grid) array then electrically couples the die to the next-level component, which includes a mating array of terminals (e.g., pin sockets, bond pads, etc.).

During operation of the IC device 100, heat generated by the die 110 can damage the die if this heat is not transferred away from the die or otherwise dissipated. To remove heat from the die 110, the die 110 is ultimately coupled with a heat sink 170 via a number of thermally conductive components, including a first thermal interface 140, a heat spreader 150, and a second thermal interface 160. The first thermal interface 140 is coupled with an upper surface of the die 110, and this thermal interface conducts heat from the die and to the heat spreader 150. Heat spreader 150 conducts heat laterally within itself to "spread" the heat laterally outwards from the die 110, and the heat spreader 150 also conducts the heat to the second thermal interface 160. The second thermal interface 160 conducts the heat to heat sink 170, which transfers the heat to the ambient environment. Heat sink 170 may include a plurality of fins 172, or other similar features providing increased surface area, to facilitate convection of heat to the surrounding air. The IC device 100 may also include a seal element 180 to seal the die 110 from the operating environment.

The efficient removal of heat from the die 110 depends on the performance of the first and second thermal interfaces 140, 160, as well as the heat spreader 150. As the power dissipation of processing devices increases with each design generation, the thermal performance of these devices becomes even more critical. To efficiently conduct heat away from the die 110 and toward the heat sink 170, the first and second thermal interfaces 140, 160 should efficiently conduct heat in a transverse direction (see arrow 105).

At the first thermal interface, it is known to use a layer of thermal grease disposed between the die 110 and the heat spreader 150. Thermal greases are, however, unsuitable for high power—and, hence, high heat—applications, as these materials lack sufficient thermal conductivity to efficiently remove a substantial heat load. It is also known to use a layer of a low melting point metal alloy (e.g., a solder) as the first thermal interface 140. However, these low melting point alloys are difficult to apply in a thin, uniform layer on the die 110, and these materials may also exhibit low reliability. Examples of materials used at the second thermal interface include thermally conductive epoxies and other thermally conductive polymer materials.

DETAILED DESCRIPTION OF THE INVENTION

Figure 1:
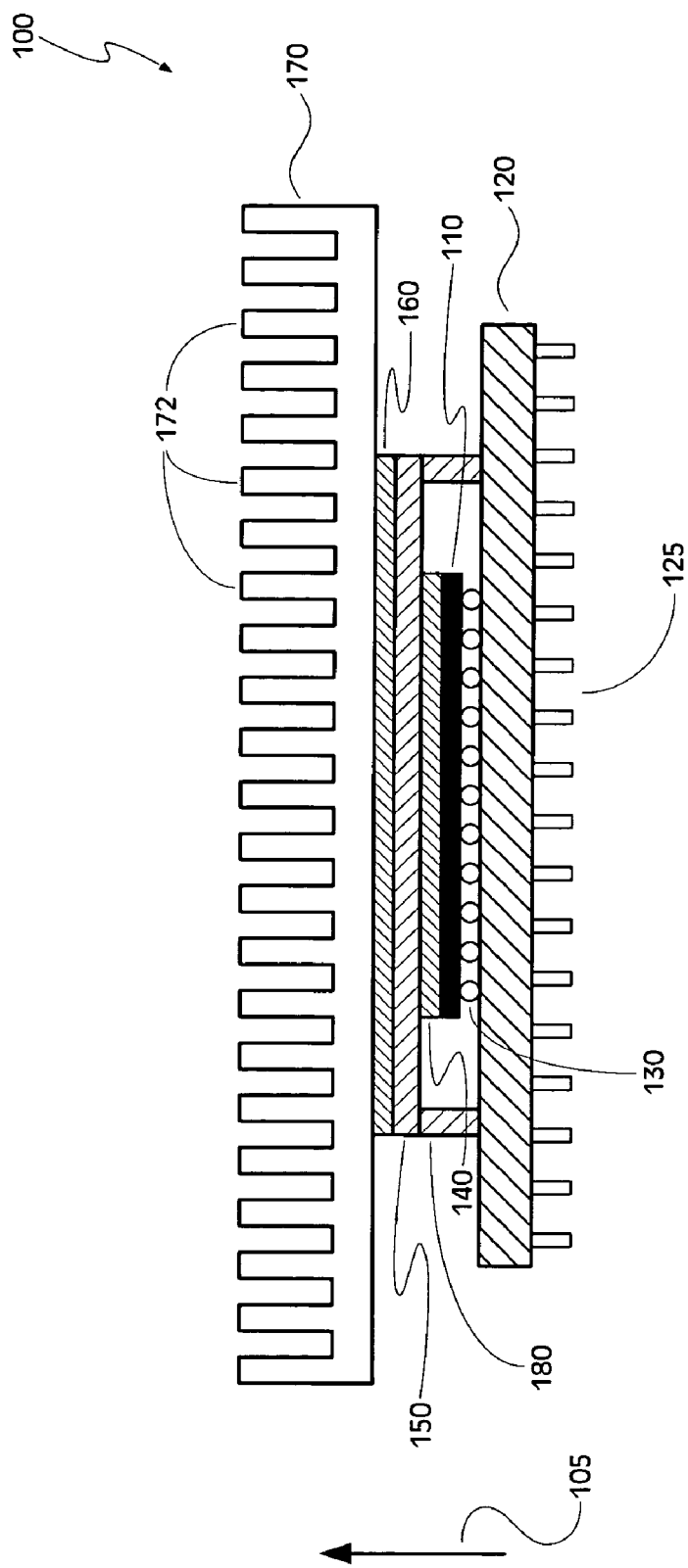
FIG. 1 is a cross-sectional elevation view of a conventional integrated circuit package.

Illustrated in FIGS. 2 through 5 are embodiments of a method for fabricating a composite carbon nanotube structure that may be used as a thermal interface device in an IC device (e.g., the IC device 100 of FIG. 1). In one of the disclosed embodiments, an array of carbon nanotubes is formed on a substrate, such as a package substrate, and a metal material is deposited over the carbon nanotubes and the substrate, such that the carbon nanotubes are disposed in a metal matrix. The metal matrix including the array of carbon nanotubes may be used as a thermal interface device in a packaged IC device, such as the thermal interfaces 140, 160 of the IC device 100 of FIG. 1. However, although the disclosed embodiments are explained in the context of manufacturing thermal interface devices for IC chips, it should be understood that the disclosed thermal interface devices and the methods for their production may find application in a wide variety of applications where a thermally conductive element is needed or where a composite carbon nanotubes structure is desired (e.g., field emission displays, data storage devices, as well as other electronic and photonic devices).

Figure 8:
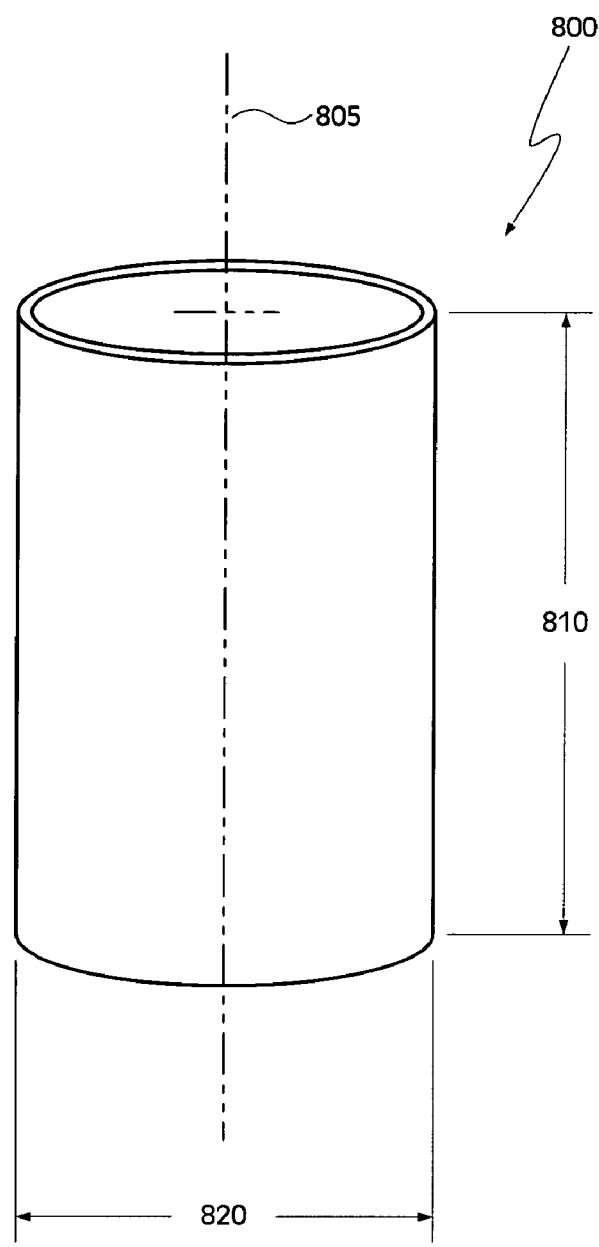
FIG. 8 is a perspective view of an example of a conventional carbon nanotube.

An example of a typical carbon nanotube 800 is shown in FIG. 8. The carbon nanotube (or "CNT") is generally cylindrical in shape and may be single walled or multi-walled. The carbon nanotube 800 extends along a primary axis 805, and the nanotube 800 has a height 810 and a diameter 820. The height 810 may be up to 50 μm in length for a multi-walled carbon nanotube and up to 2 cm in length for a single walled carbon nanotube. For multi-walled carbon nanotubes, the diameter 820 may be up to 100 nm, and for single walled carbon nanotubes, the diameter 820 may be up to 30 nm. Carbon nanotubes are characterized by high mechanical strength, good chemical stability, and high thermal conductivity, especially in a direction along their primary axis 805.

Figure 2:
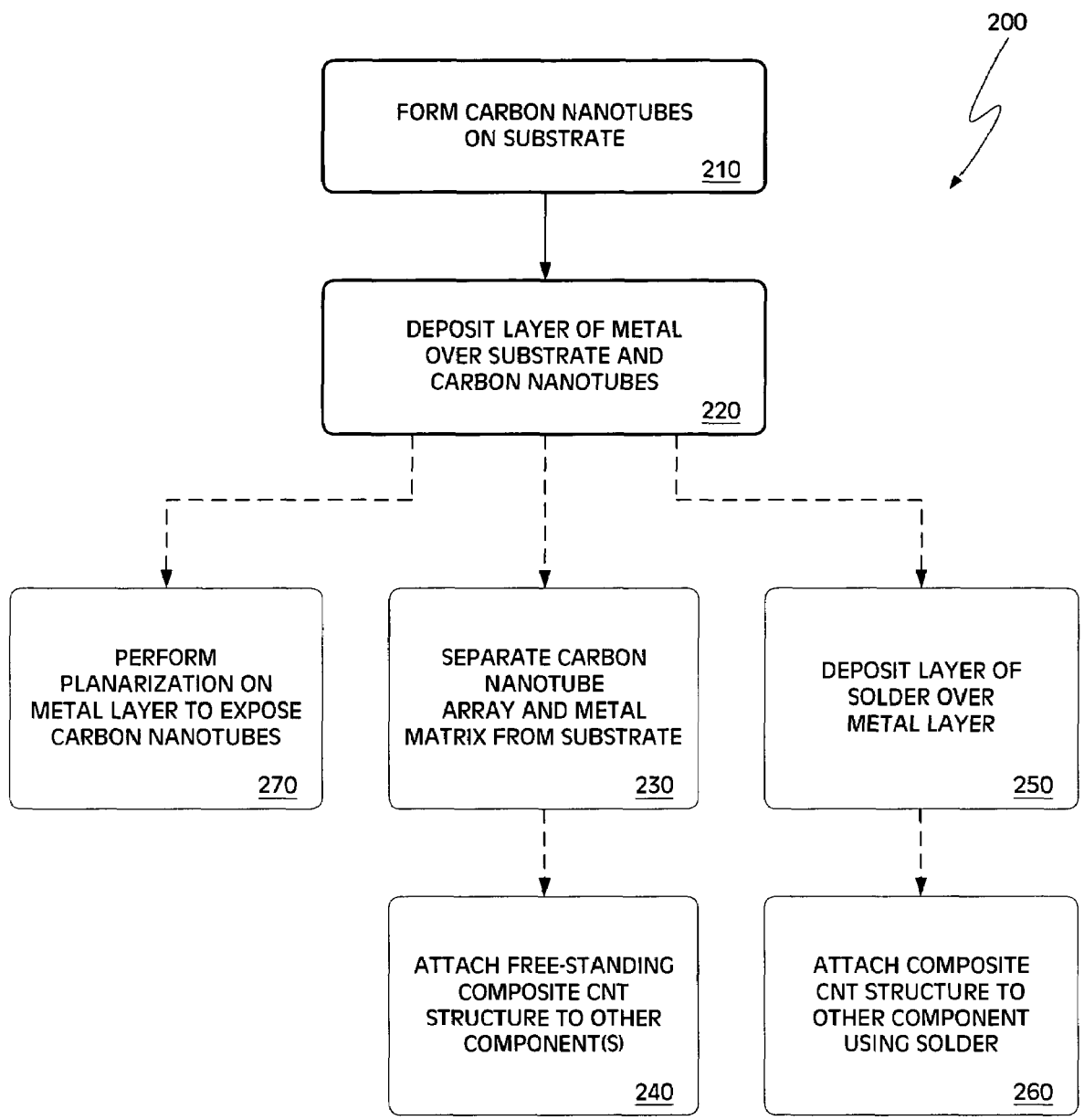
FIG. 2 is a block diagram illustrating an embodiment of a method of fabricating a composite carbon nanotube structure.

Illustrated in FIG. 2 is an embodiment of a method 200 of fabricating a composite carbon nanotube structure comprising an array of carbon nanotubes disposed within a metal matrix. Also, the method 200 of FIG. 2 is further illustrated in FIGS. 3A through 6B, and reference should be made to these figures along with FIG. 2, as called out in the text.

Figure 3A:
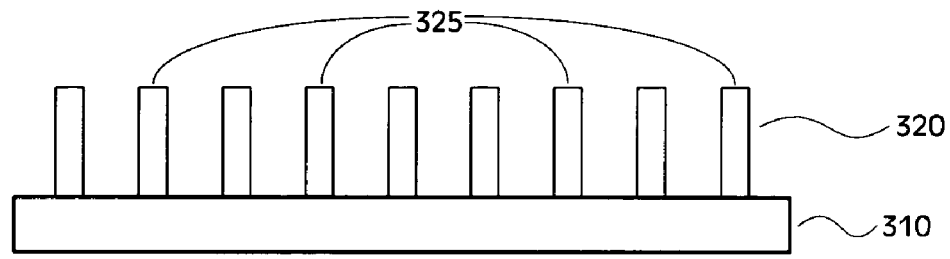
FIGS. 3A–3D are schematic diagrams illustrating an embodiment of the method for fabricating a composite carbon nanotube structure, as shown in FIG. 2.

Referring now to block 210 in FIG. 2, a number of carbon nanotubes are formed on a substrate. This is illustrated in FIG. 3A, where an array 320 of carbon nanotubes 325 has been formed on a surface of a substrate 310. In one embodiment, the substrate 310 comprises an integrated circuit die. In another embodiment, the substrate comprises a semiconductor wafer upon which integrated circuitry has been formed (that is to be cut into a number of IC die). In a further embodiment, the substrate comprises a heat spreader (e.g., the heat spreader 150 shown in FIG. 1), and in yet another embodiment, the substrate comprises a heat sink (e.g., the heat sink 170 of FIG. 1). In yet a further embodiment, the substrate comprises a sacrificial substrate that is ultimately separated from the structure formed thereon, as will be explained in more detail below.

Any suitable process may be employed to form the carbon nanotubes on the substrate, and these carbon nanotubes may be single walled or multi-walled. In one embodiment, a catalyst is deposited on the substrate and chemical vapor deposition (CVD) is employed to form the carbon nanotubes on the catalyst. In another embodiment, a CVD process with a gas-phase catalyst delivery is utilized to grow the carbon nanotubes. Each of these embodiments is described in turn below. It should be understood, however, that the disclosed embodiments are not limited to the carbon nanotube formation processes described herein and, further, that carbon nanotubes may be formed using other methods.

Figure 4:
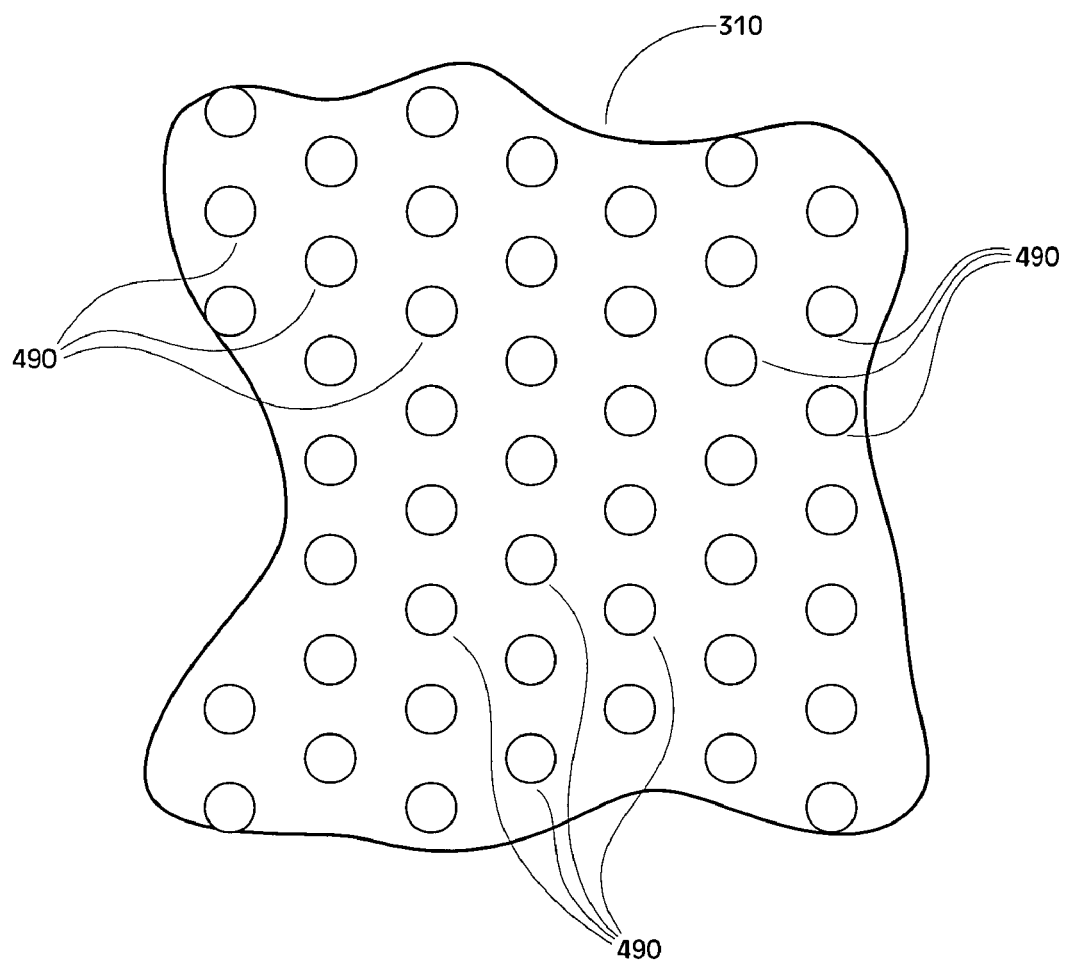
FIG. 4 is a schematic diagram illustrating another embodiment of the method for fabricating a composite carbon nanotube structure, as shown in FIG. 2.

For the first of the above-described embodiments, a layer of catalyst is first deposited on a surface of the substrate 310. This is illustrated in FIG. 4, where a patterned layer of catalyst 490 has been deposited on the substrate 310 (only a portion of substrate 310 shown in FIG. 4). Any suitable process may be used to deposit the catalyst layer 490 over the substrate 310. In one embodiment, a thin layer of catalyst is first deposited using any suitable deposition process—e.g., electroplating, electroless plating, sputtering, chemical vapor deposition (CVD), as well as others—and well known photolithography and etching techniques may then be employed to form the desired pattern of the catalyst. The catalyst comprises any material upon which growth of a carbon nanotube can be initiated—i.e., the catalyst provides nucleation sites—and suitable catalysts include iron (Fe), Nickel (Ni), and Cobalt (Co), as well as their combinations. The layer of catalyst 490 may be formed to a thickness of between approximately 1 and 50 nm (nanometers).

Generally, due to the substrate material and process conditions, carbon nanotubes 325 grow on the catalyst 490 and not the surface of substrate 310 (or at least grow preferentially on the catalyst rather than the substrate). Thus, the configuration of the array of carbon nanotubes 320 corresponds to the pattern of the layer of catalyst 490 formed on the substrate 310. As shown in FIG. 4, the layer of catalyst 490 comprises a plurality of small, isolated deposits, or "islands" (shown in FIG. 4 simply as circles for ease of illustration; however, it should be understood that these islands may have any shape or configuration). Carbon nanotubes 325 will then grow from these small islands of catalyst 490, but not on the surface of substrate 310, and the pattern of the carbon nanotube array 320 corresponds to the pattern of the layer of catalyst 490. In FIG. 4, the catalyst 490 is formed in a well defined, two-dimensional grid; however, it should be understood that the catalyst 490—and, hence, the carbon nanotubes—can be formed according to any desired pattern or configuration.

After deposition of the catalyst 490, chemical vapor deposition is used to form the carbon nanotubes 325, which will grow substantially perpendicular to the upper surface of the substrate 310 during the CVD process. As described above, the islands of catalyst 490 on substrate 310 serve as nucleation sites at which carbon nanotubes 325 will grow. In one embodiment, the substrate 310 is heated, and CVD is performed by introducing a carbon-containing precursor into the deposition chamber. The substrate 310 may be heated to a temperature of approximately 700° C., at a pressure of 1 atm. Suitable precursors include methane, ethylene, and acetylene, as well as other carbon-containing gases and mixtures. In a further embodiment, a plasma is generated in the deposition chamber—e.g., as may be accomplished by introducing microwaves into the deposition chamber—and this plasma assists carbon nanotube formation, a process referred to as plasma enhanced CVD (or PECVD). For PECVD, the substrate 310 may be heated to a temperature of approximately 825° C., at a pressure of 20 Torr, and a 1 kW microwave plasma may be used. It should be understood that, for carbon nanotube formation using either CVD or PECVD, the above-stated process conditions represent only a few examples of process conditions that may be utilized during carbon nanotube growth and, further, that carbon nanotubes may be formed using any suitable process under any suitable set of conditions.

For the second of the above-described embodiments for forming carbon nanotubes, carbon nanotube formation is carried out using chemical vapor deposition and a gas-phase catalyst. In this embodiment, the substrate is silicon (Si), and a layer of silica ($SiO_2$) is formed on the silicon substrate. Deposition of a blanket silica layer followed by photolithography and etching may be used to form any desired pattern of silica on the silicon substrate, such as a two-dimensional grid (see FIG. 4) or other desired pattern. Thus, as with the catalyst 490 in the prior embodiment, the silica is formed on the silicon substrate as a patterned layer comprising a number of small islands. The silica layer may be formed to a thickness of between 80 nm and 9 μm.

Chemical vapor deposition is then employed to grow carbon nanotubes on the silica pattern. During carbon nanotube growth, a vapor mixture of xylene ($C_8H_{10}$) and ferrocene ($Fe(C_5H_2)_2$), or other suitable mixture, is introduced into the deposition chamber. This precursor/catalyst combination causes selective growth of carbon nanotubes on the silica, but no nanotube growth on the silicon substrate. Carbon nanotube growth readily occurs on the silica at a direction substantially normal to the underlying silicon surface. The substrate 310 may be heated up to a temperature of approximately 800° C., at a pressure of 1 Torr, during nanotube growth. Once again, the above-described process conditions represent but one example of the conditions under which carbon nanotube growth can be achieved, and it should be understood that any suitable process and set of conditions may be employed to grow the carbon nanotubes.

Figure 3B:
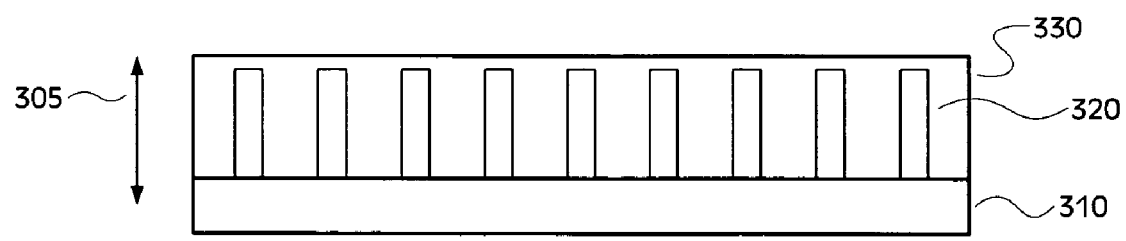

Referring again to FIG. 2, after growth of the carbon nanotubes, a layer of metal is deposited over the carbon nanotube array and the substrate, as set forth at block 220. This is illustrated in FIG. 3B, where a metal layer 330 has been deposited over the carbon nanotube array 320 and the exposed surfaces of the substrate 310, and this metal layer 330 forms a metal matrix around the carbon nanotubes 325. Any suitable process may be used to deposit the layer of metal over the carbon nanotube array 320 and substrate 310, including electroplating, electroless plating, sputtering, and CVD. The metal material may comprise copper (Cu), Aluminum (Al), Gold (Au), Silver (Ag), or Nickel (Ni), as well as any other suitable metal or combination of metals. In another embodiment, rather than a metal material, a layer of a non-metallic material (e.g., a polymer material) is formed over the carbon nanotube array and substrate.

The carbon nanotubes 325 form substantially normal to the upper surface of substrate 310 during formation, as noted above, and the primary axis (see FIG. 8, reference numeral 805) of each nanotube 325 will also be substantially normal to the substrate 310. Thus, the carbon nanotubes 325 extend through the metal matrix 330 and provide excellent thermal conductivity through this matrix in a direction normal thereto (see FIG. 3B, arrow 305). Furthermore, the CNT-containing metal matrix 330 may have a thickness no greater than the height of the carbon nanotubes 325, and this small thickness will further improve the thermal performance of this composite carbon nanotube structure when functioning as a thermal interface device.

Figure 3C:

In a further embodiment, which is shown in FIG. 2, the metal layer and the carbon nanotube array are separated from the substrate, as set forth at block 230. This is shown in FIG. 3C, where the metal layer 330 and carbon nanotube array 320 have been separated from the substrate 310. When separated, the metal matrix 330 with the carbon nanotube array 320 forms a free-standing composite carbon nanotube structure 300, and this free-standing composite CNT structure 300 may be used as a thermal interface device (e.g., the first or second thermal interface devices 140, 160 of the IC device 100 shown in FIG. 1). In one embodiment, where a layer of metal catalyst has been deposited on the substrate, separation may be achieved by releasing the metal matrix 330 with carbon nanotubes 320 from the metal layer. In another embodiment, where the substrate 310 comprises a silicon substrate (with a silica layer), the free-standing composite CNT structure 300 may be formed by etching away the silicon substrate and silica layer.

Figure 5:
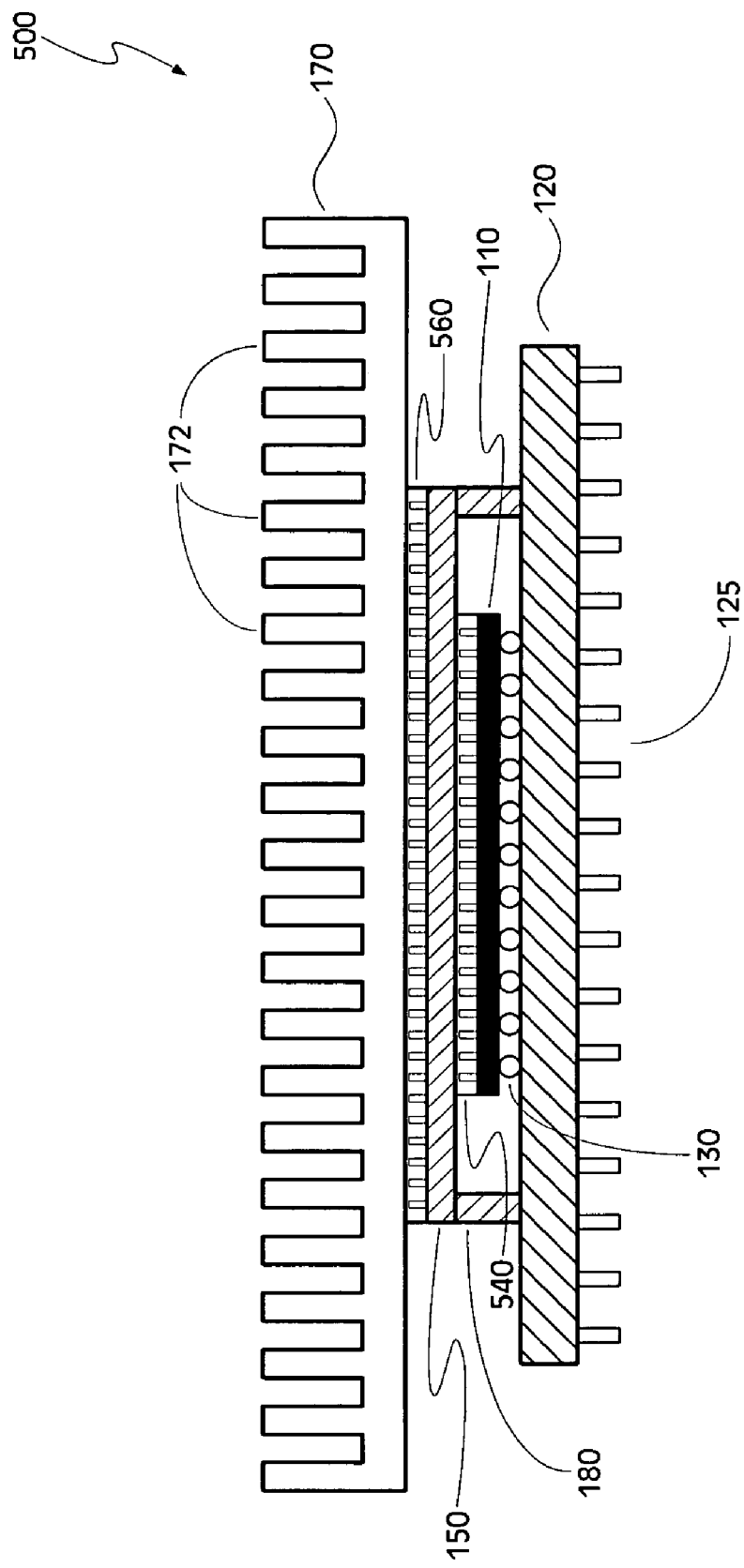
FIG. 5 is a schematic diagram illustrating a cross-sectional elevation view of an embodiment of an integrated circuit package including free-standing thermal interface devices constructed according to the method for fabricating a composite carbon nanotube structure of FIG. 2.

As noted above, the free-standing composite CNT structure 300 may be used as a thermal interface device, and such a thermal interface device may be attached to an integrated circuit die, a heat spreader, a heat sink, or other component, as set forth at block 240. For example, referring to FIG. 5, a packaged IC device 500 includes a thermal interface device 540 disposed between an integrated circuit die 110 and a heat spreader 150, and this thermal interface device comprises a free-standing composite CNT structure. A composite CNT structure may also be used as a thermal interface device 560 between the heat spreader 150 and a heat sink 170, as illustrated in FIG. 5.

Figure 3D:
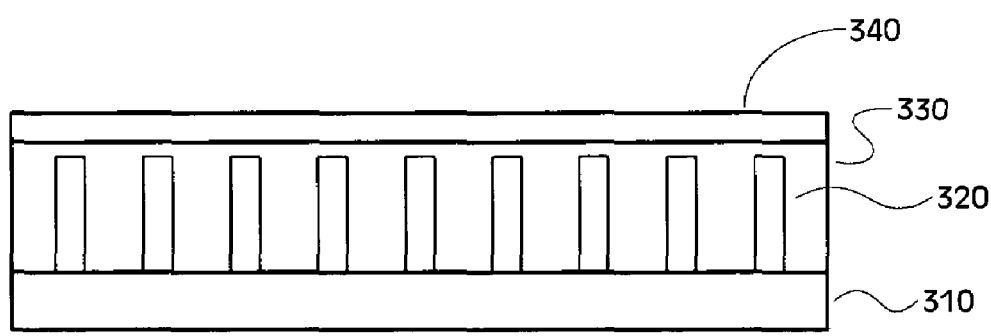

In yet another embodiment, which is also illustrated in FIG. 2, a layer of solder is deposited over the metal layer, as set forth at block 250. This is shown in FIG. 3D, where a layer of solder 340 has been disposed on the metal layer 330 (and any exposed surfaces of the carbon nanotubes 325). The solder layer 340 may be deposited using any suitable coating or deposition process (e.g., electroplating, electroless plating, sputtering, etc.). If the substrate 310 comprises a heat spreader (e.g., heat spreader 150 of FIG. 1), the solder layer 340 may be used for attachment to an integrated circuit die (e.g., die 110 of FIG. 1) or other component, as set forth at block 260.

As shown in FIG. 3B, the metal layer 330 extends above the upper ends of the carbon nanotubes 325, a result that occurs because, in practice, it may be difficult to protect the ends of the carbon nanotubes 325 during the metal deposition process. This is further illustrated in FIG. 6A (only a portion of substrate and metal matrix shown in this figure), wherein an upper surface 332 of the metal layer 330 extends above some of the carbon nanotubes 325, although others of the carbon nanotubes 325 may protrude above the metal layer or otherwise remain exposed through the metal layer. When used as a thermal interface device, the metal layer 330 extending over the ends of the carbon nanotubes 325 may decrease the thermal conductivity of the composite CNT structure.

Figure 6A:
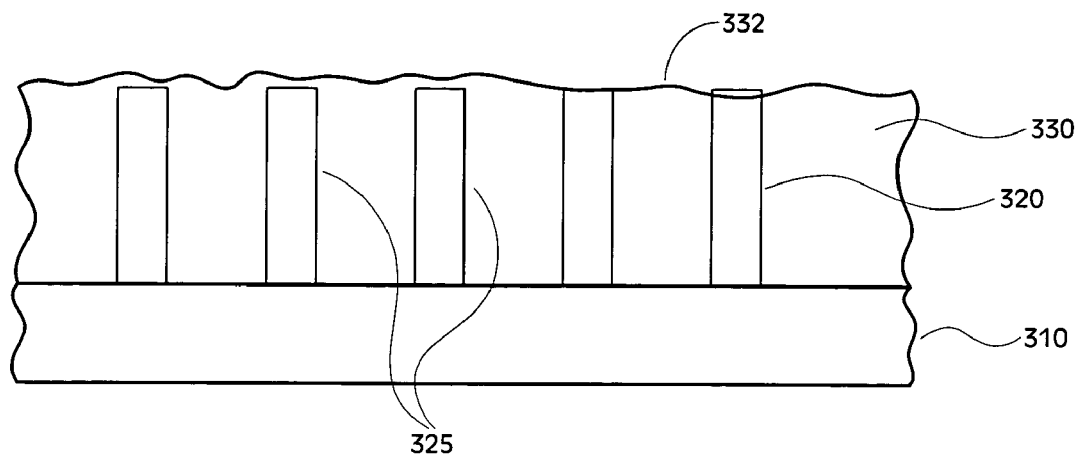
FIGS. 6A–6B are schematic diagrams illustrating yet another embodiment of the method for fabricating a composite carbon nanotube structure, as shown in FIG. 2.
Figure 6B:
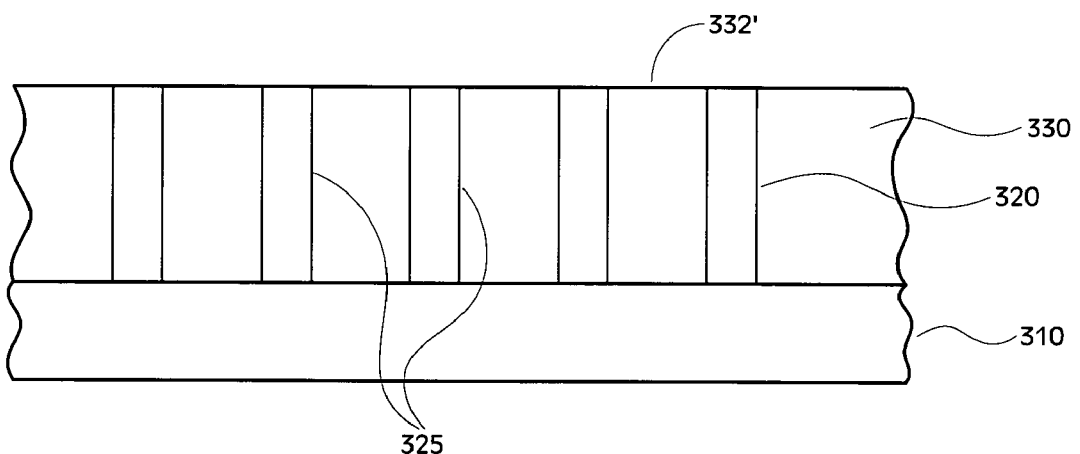

In a further embodiment, in order to provide improved thermal conductivity through the metal matrix, a planarization process (e.g., chemical mechanical polishing, or CMP) may be performed on the metal layer 330 to expose the ends of the carbon nanotubes 325, as set forth at block 270 in FIG. 2. This is illustrated in FIG. 6B (only a portion of substrate and metal matrix shown in this figure), where the metal layer 330 has been planarized, such that the ends of the carbon nanotubes 325 are exposed through the upper surface 332' of the metal layer 330. It should be understood that other material removal processes, such as etching (e.g., plasma etching), may be employed to remove excess metal material in order to expose the ends of the carbon nanotubes 325. For the free-standing composite CNT structure 300 described above (see FIG. 3C), planarization (or other material removal process) may be performed on both the upper and lower surfaces of the composite CNT structure.

It should be understood that, although the various alternative embodiments described above with respect to blocks 230 through 270 in FIG. 2 have been described separately, these embodiments may be employed in combination. For example, a layer of solder (see FIG. 3D) may be deposited on a free-standing composite CNT structure (see FIG. 3C). Similarly, planarization may be performed on a free-standing composite CNT structure, as well as CNT-containing metal matrix that has not been separated from the underlying substrate.

An IC device having a thermal interface comprising a free-standing composite CNT structure—e.g., the packaged IC device 500 having thermal interface devices 540, 560, as shown in FIG. 5—may find application in any type of computing system or device. An embodiment of such a computer system is illustrated in FIG. 7.

Figure 7:
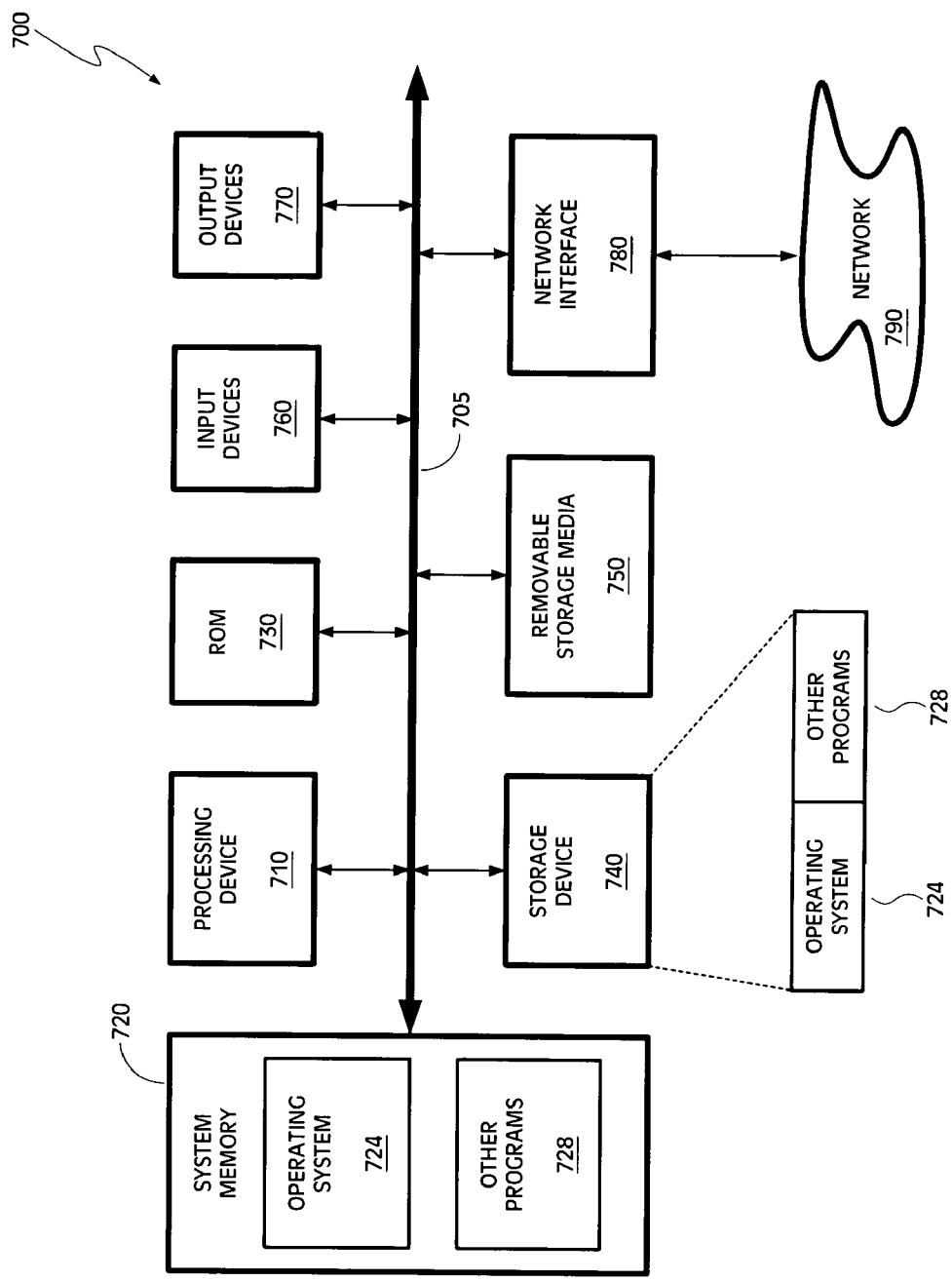
FIG. 7 is a schematic diagram of a computer system including an integrated circuit device having a free-standing thermal interface device constructed according to the method for fabricating a composite carbon nanotube structure of FIG. 2.

Referring to FIG. 7, the computer system 700 includes a bus 705 to which various components are coupled. Bus 705 is intended to represent a collection of one or more buses—e.g., a system bus, a Peripheral Component Interface (PCI) bus, a Small Computer System Interface (SCSI) bus, etc.— that interconnect the components of computer system 700. Representation of these buses as a single bus 705 is provided for ease of understanding, and it should be understood that the computer system 700 is not so limited. Those of ordinary skill in the art will appreciate that the computer system 700 may have any suitable bus architecture and may include any number and combination of buses.

Coupled with bus 705 is a processing device (or devices) 710. The processing device 710 may comprise any suitable processing device or system, including a microprocessor, a network processor, an application specific integrated circuit (ASIC), or a field programmable gate array (FPGA), or similar device. In one embodiment, the processing device 710 comprises an IC device including a free-standing composite CNT structure (e.g., packaged IC device 500 having thermal interface devices 540, 560). However, it should be understood that the disclosed thermal interface devices comprising a composite CNT structure may find use in other types of IC devices (e.g., memory devices).

Computer system 700 also includes system memory 720 coupled with bus 705, the system memory 720 comprising, for example, any suitable type of random access memory (e.g., dynamic random access memory, or DRAM). During operation of computer system 700 an operating system 724, as well as other programs 728, may be resident in the system memory 720. Computer system 700 may further include a read-only memory (ROM) 730 coupled with the bus 705. During operation, the ROM 730 may store temporary instructions and variables for processing device 710, and ROM 730 may also have resident thereon a system BIOS (Basic Input/Output System). The computer system 700 may also include a storage device 740 coupled with the bus 705. The storage device 740 comprises any suitable non-volatile memory—such as, for example, a hard disk drive—and the operating system 724 and other programs 728 may be stored in the storage device 740. Further, a device 750 for accessing removable storage media (e.g., a floppy disk drive or CD ROM drive) may be coupled with bus 705.

The computer system 700 may include one or more input devices 760 coupled with the bus 705. Common input devices 760 include keyboards, pointing devices such as a mouse, and scanners or other data entry devices. One or more output devices 770 may also be coupled with the bus 705. Common output devices 770 include video monitors, printing devices, and audio output devices (e.g., a sound card and speakers). Computer system 700 further comprises a network interface 780 coupled with bus 705. The network interface 780 comprises any suitable hardware, software, or combination of hardware and software capable of coupling the computer system 700 with a network (or networks) 790.

It should be understood that the computer system 700 illustrated in FIG. 7 is intended to represent an exemplary embodiment of such a computer system and, further, that this computer system may include many additional components, which have been omitted for clarity and ease of understanding. By way of example, the computer system 700 may include a DMA (direct memory access) controller, a chip set associated with the processing device 710, additional memory (e.g., a cache memory), as well as additional signal lines and buses. Also, it should be understood that the computer system 700 may not include all of the components shown in FIG. 7.

Embodiments of a method 200 for fabricating a composite carbon nanotube structure—as well as embodiments of a thermal interface device comprising such a composite CNT structure—having been herein described, those of ordinary skill in the art will appreciate the advantages of the disclosed embodiments. The disclosed composite CNT structure provides high thermal conductivity, high mechanical strength, and good chemical stability. Further, these composite CNT structures may be fabricated to a very thin and uniform thickness. Also, the disclosed composite CNT structures may be fabricated using well known, low cost methods (e.g., CVD, PECVD, electroplating, electroless plating, sputtering, etc.), and their fabrication and use as thermal interface devices is compatible with existing assembly and process conditions.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

What is claimed is:

1. A method comprising:
    forming a number of carbon nanotubes on a surface of a substrate;
    depositing a layer of a metal material over the carbon nanotubes and exposed portions of the substrate surface to form a metal matrix around the carbon nanotubes; and
    separating the metal matrix and carbon nanotubes from the substrate to form a free-standing thermal interface device.

2. The method of claim 1, further comprising performing a planarization process on the layer of metal material to remove excess metal material and expose the carbon nanotubes.

3. The method of claim 1, further comprising performing an etching process on the layer of metal material to remove excess metal material and expose the carbon nanotubes.

4. The method of claim 1, wherein the substrate comprises a semiconductor material.

5. The method of claim 1, wherein the metal material comprises one of copper, aluminum, gold, silver, and nickel.

6. The method of claim 1, wherein each of the carbon nanotubes has a primary axis substantially perpendicular to the surface of the substrate.

7. The method of claim 1, further comprising attaching one side of the free-standing thermal interface device to an integrated circuit die.

8. The method of claim 1, further comprising attaching an opposing side of the thermal interface device to a heat spreader.

9. The method of claim 1, further comprising depositing a layer of solder over the layer of metal.

10. The method of claim 9, further comprising attaching the free-standing thermal interface device to an integrated circuit die using the layer of solder.

11. The method of claim 1, wherein forming a number of carbon nanotubes on a surface of a substrate comprises:
    forming a patterned layer of a catalyst over the surface of the substrate; and
    performing chemical vapor deposition to grow carbon nanotubes on the patterned layer of catalyst.

12. The method of claim 11, wherein the catalyst comprises one of iron, nickel, and cobalt.

13. The method of claim 11, wherein the chemical vapor deposition is performed using a precursor.

14. The method of claim 13, wherein the precursor comprises one of methane, ethylene, and acetylene.

15. The method of claim 11, further comprising performing the chemical vapor deposition in the presence of a plasma.

16. The method of claim 1, wherein forming a number of carbon nanotubes on a surface of a substrate comprises:
forming a patterned layer of silica on the substrate, the substrate comprising silicon; and
performing chemical vapor deposition to grow the carbon nanotubes on the patterned layer of silica.

17. The method of claim 16, wherein the chemical vapor deposition is performed using a mixture including a carbon-containing precursor and a catalyst.

18. The method of claim 17, wherein the mixture comprises xylene and ferrocene.

19. A method comprising:
forming a number of carbon nanotubes on a surface of a substrate;
depositing a layer of a material over the carbon nanotubes and exposed portions of the substrate surface to form a matrix around the carbon nanotubes;
separating the matrix and carbon nanotubes from the substrate to form a free-standing thermal interface device;
attaching one side of the free-standing thermal interface device to a first component, the free-standing thermal interface device having a periphery substantially corresponding to a periphery of the first component; and
attaching an opposing side of the free-standing thermal interface device to a second component.

20. The method of claim 19, wherein the material comprises a polymer material.

21. The method of claim 19, wherein the material comprises a non-metallic material.

22. The method of claim 19, wherein the first component comprises an integrated circuit die and the second component comprises a heat spreader.

23. The method of claim 19, wherein the first component comprises a heat spreader and the second component comprises a heat sink.

24. The method of claim 19, further comprising performing a planarization process on the layer of material to remove excess material and expose the carbon nanotubes.

25. The method of claim 19, further comprising performing an etching process on the layer of material to remove excess material and expose the carbon nanotubes.

26. The method of claim 19, wherein the substrate comprises a semiconductor material.

27. The method of claim 19, wherein each of the carbon nanotubes has a primary axis substantially perpendicular to the surface of the substrate.

28. The method of claim 19, wherein forming a number of carbon nanotubes on a surface of a substrate comprises:
forming a patterned layer of a catalyst over the surface of the substrate; and performing chemical vapor deposition to grow carbon nanotubes on the patterned layer of catalyst.

29. The method of claim 28, wherein the catalyst comprises one of iron, nickel, and cobalt.

30. The method of claim 28, further comprising performing the chemical vapor deposition in the presence of a plasma.

31. The method of claim 28, wherein the chemical vapor deposition is performed using a precursor.

32. The method of claim 31, wherein the precursor comprises one of methane, ethylene, and acetylene.

33. The method of claim 19, wherein forming a number of carbon nanotubes on a surface of a substrate comprises:
forming a patterned layer of silica on the substrate, the substrate comprising silicon; and performing chemical vapor deposition to grow the carbon nanotubes on the patterned layer of silica.

34. The method of claim 33, wherein the chemical vapor deposition is performed using a mixture including a carbon-containing precursor and a catalyst.

35. The method of claim 34, wherein the mixture comprises xylene and ferrocene.

* * * * *

UNITED STATES PATENT AND TRADEMARK OFFICE
CERTIFICATE OF CORRECTION

| | | |
|---|---|---|
| PATENT NO. | : 7,118,941 B2 | Page 1 of 1 |
| APPLICATION NO. | : 10/607390 | |
| DATED | : October 10, 2006 | |
| INVENTOR(S) | : Zhang et al. | |

It is certified that error appears in the above-identified patent and that said Letters Patent is hereby corrected as shown below:

In column 8, at line 49, delete "claim 1" and insert --claim 7--.

Signed and Sealed this

Tenth Day of April, 2007

JON W. DUDAS
*Director of the United States Patent and Trademark Office*